United States Patent [19]

Davis et al.

[11] 3,911,294

[45] Oct. 7, 1975

[54] DRIVER CIRCUIT FOR HIGH SPEED GATING OF A FIELD EFFECT TRANSISTOR

[75] Inventors: Paul Cooper Davis; Milton Luther Embree, both of Reading, Pa.

[73] Assignee: Bell Telephone Laboratories, Incorporated, Murray Hill, N.J.

[22] Filed: Aug. 16, 1974

[21] Appl. No.: 497,900

[52] U.S. Cl. ................ 307/251; 307/254; 307/270; 307/279

[51] Int. Cl.² ........................................ H03K 17/00

[58] Field of Search ........... 307/251, 254, 270, 279, 307/313

[56] References Cited

UNITED STATES PATENTS 3,678,297 7/1972 Takahashi.......................... 307/251

*Primary Examiner*—Michael J. Lynch
*Assistant Examiner*—B. P. Davis
*Attorney, Agent, or Firm*—G. E. Murphy

[57] ABSTRACT

A circuit for gating field effect transistors which is specifically advantageous for gating junction field effect transistors is disclosed. The circuit includes means for operating the gated or driven transistor in an ON state with a predetermined forward gate current, and alternately selectable means for operating the driven transistor in an ON state with a predetermined gate-source voltage which does not cause substantial gate current. The driver circuit can be realized in integrated circuit form wherein the desired operating mode is established by connection to a single circuit terminal.

9 Claims, 1 Drawing Figure

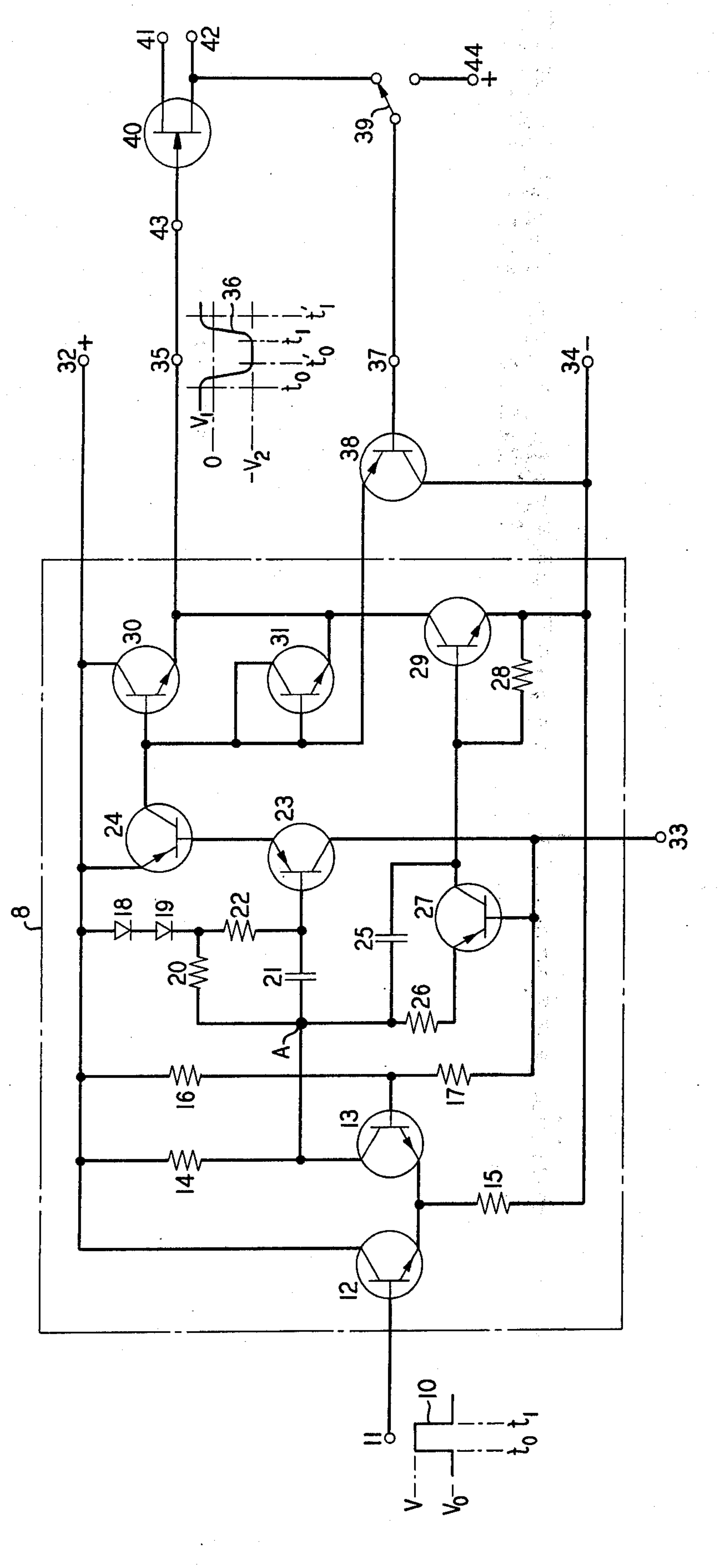

DRIVER CIRCUIT FOR HIGH SPEED GATING OF A FIELD EFFECT TRANSISTOR

Background of the Invention

1. Field of the Invention

This invention pertains to switching circuitry, and more particularly to circuitry which may be employed to drive or gate a field effect transistor.

The field effect transistor (FET) has found wide acceptance as a signal switching device. Both the insulated gate FET (IGFET) and the junction FET (JFET) exhibit a relatively high drain-to-source conductance ON state and a relatively low drain-to-source conductance OFF state in response to proper drive signals applied to the FET gate electrode. Advantageously, either type FET offers solid-state reliability and miniaturization, thus providing a desirable alternative to prior art mechanical switches and relays. Moreover, both types of FETs generally require less power to activate than prior art bipolar transistor switches.

In applications, such as the switching of analog signals, the JFET is often somewhat preferred over the IGFET because of the JFET's lower ON state drain-to-source resistance and the fact that during the ON state the JFET channel resistance is not significantly modulated by the switched analog signal. However, the JFET gate electrode, unlike that of the IGFET, is not electrically isolated from the source-and-drain electrodes and the circuit using a JFET must therefore be protected from excessive forward current flow through the gate junction to either the source or drain circuits.

2. Description of the Prior Art

In the copending application of V. R. Saari, Ser. No. 445,492, entitled "Driver Circuit for High Speed Gating of a Field Effect Transistor," filed Feb. 25, 1974, (Case 14) a circuit is described in which two circuit paths are utilized to rapidly switch a driven FET into conducting ON and nonconducting OFF states. The circuit path which switches the driven JFET into the OFF state exhibits a low output impedance to provide maximum noise immunity. The circuit path which switches the driven JFET into the ON state, however, exhibits a high output impedance and thus a substantially constant drive current so that during the ON state, the driven JFET is maintained with a predetermined forward gate current. The operation of the driven JFET under such a forward biased condition is advantageous in some applications since the ON resistance, or effective JFET drain-to-source resistance, is very low. Moreover, establishing the current at a predetermined value protects the driven JFET from excessive forward gate currents which can destroy the device.

In other applications, however, operation of the driven JFET with a forward gate current is not desirable. For example, in some applications of analog signal switching, the injected gating current may cause undesirable effects in analog circuitry which is often connected in series with the JFET drain-source path. In situations such as these, it is far more advantageous to maintain the gate-to-source voltage of the driven JFET at a level which ensures a relatively low ON resistance without forward biasing the gate-source junction. It should be realized that, in such a driver circuit, the gate voltage of the driven JFET should effectively follow or track the source potential, even in the presence of substantial analog source signals. This tracking will ensure that the driven JFET drain-source resistance does not vary with the analog signal, thereby causing distortion.

One prior art switching circuit which includes means for maintaining a prescribed voltage between the gate and source electrodes of a driven JFET is disclosed by Susumu Takahashi, in U.S. Pat. No. 3,678,297, issued July 18, 1972.

It would appear that, although the prior art includes circuits for operating the driven JFET in an ON state with a predetermined forward bias current flow through the gate electrode and also includes circuits for operating the driven JFET in an ON state with a predetermined gate-to-source voltage of magnitude insufficient to effect substantial gate current, the prior art does not include a circuit which can be optionally operated in either of these two modes. Such a circuit is especially advantageous when realized as an integrated circuit which allows the user to select the desired mode of operation simply by suitably connecting a single circuit lead.

Accordingly, it is an object of the present invention to provide a driver circuit which is capable of driving a connected JFET such that during the JFET ON state, the gate-source current is maintained at a predetermined value, or, at the user's discretion, is capable of driving a connected JFET such that the ON state JFET gate-to-source voltage is restricted to a predetermined value at which substantially no gate current will flow.

It is a further object of the present invention to realize a driver circuit which can be realized as a silicon integrated circuit wherein the system designer or user can elect either to operate a driven JFET with a limited gate current during the JFET ON state, or with a fixed gate-to-source voltage during the JFET ON state by means of a single electrical connection external to the integrated driver circuit.

It is a further and more specific object of the present invention to improve upon the prior art driver circuits of the type described in the aforementioned copending application of V. R. Saari, such that in one selectable mode of operation the circuit operation is not altered, but in a second selectable mode of operation, the circuit supplies a connected JFET with a substantially constant gate-to-source voltage.

BRIEF DESCRIPTION OF THE DRAWING

The single appended FIGURE is a schematic drawing of a driver circuit constructed in accordance with this invention.

DETAILED DESCRIPTION

In the FIGURE, a driver circuit of the type disclosed in the aforementioned application of V. R. Saari is contained within outline 8. As is schematically illustrated, this circuit includes a differential amplifier stage, comprising transistors 12 and 13, which is operated in a single-ended mode and connected between driver input terminal 11 and a circuit node identified as node A.

It is readily observed that circuit node A, is connected to driver output terminal 35 by two circuit paths. One path, comprising transistors 27 and 29, resistors 26 and 28, and capacitor 25, is responsive to a positive-going voltage transition of command or input signal 10 and produces the negative-most output signal potential, $-V_2$, at output terminal 35.

The second signal path which connects circuit node A with output terminal 35 includes diodes 18 and 19, which may be suitably connected transistors, resistors 20 and 22, capacitor 21, transistors 23 and 24, diode-connected transistor 31, and transistor 30. This path is responsive to a negative-going transition in command signal 10 and produces the positive-most output signal potential, $V_1$, at output terminal 35. A detailed description of the circuit contained within outline 8, and of a structurally equivalent silicon integrated circuit, may be found in the aforementioned application of V. R. Saari.

In accordance with this invention the optional operation of driver circuit 8 during the ON state as either a source of current to operate the driven JFET or as a source of a substantially constant gate-to-source voltage to maintain a driven JFET with a predetermined gate-source voltage, is controlled by transistor 38. The emitter of transistor 38 is connected to the base of transistor 30, the collector of transistor 38 is connected to bias terminal 34, and the base electrode is connected to control terminal 37. In the FIGURE, JFET 40 is an N channel transistor which can be advantageously driven by the present invention. In normal operation, JFET gate electrode 43 is connected to driven output terminal 35. JFET drain electrode 41 and source electrode 42 are respectively available for connection to the signal source and utilization means of the system employing JFET 40.

Switch 39 symbolizes means for effecting the optional modes of operation available with the present invention. It will be realized upon understanding the operation of this invention, that the desired operating node is normally effected by wiring the base electrode of transistor 38 either to a positive voltage source or to the source electrode of JFET 40.

In any case, in either of the selectable operating modes, circuit operation is identical during the nonconducting or OFF state of the driven JFET. When command signal 10 is applied to input terminal 11 the positive-going transition of command signal 10 at time $t_o$ increases the voltage drop across resistor 15, thereby decreasing the current through transistor 13 and causing the voltage at circuit node A to increase. This rise in potential causes current to flow through capacitor 25 into the base electrode of transistor 29. Simultaneously, the rise in potential causes transistors 23 and 24 to be cut off, since any charge previously stored in capacitor 21 will flow through resistors 20 and 22. The increased base current of transistor 29 causes it to become slightly saturated, which, in turn, causes the potential at output terminal 35 to approach the negative fixed bias potential applied to terminal 34. Thus, as depicted by output signal 36, the output potential reaches a negative voltage level, $-V_2$, which is capable of driving JFET 40 into the nonconducting OFF state.

Although the described current flow through capacitor 24 ceases as the circuit reaches an equilibrium state with command signal 10 at the positive-most level, +V, output voltage 36 remains at its negative-most level, $-V_2$, since transistor 29 is maintained in a saturated state. The base current necessary to sustain transistor 29 in this state is provided by transistor 27 which begins to conduct, through resistor 26, as the voltage across the capacitor 25 increases.

The mode of operation in which driven JFET 40 is operated with a predetermined gate current is effected by connecting control terminal 37 to a positive reference or bias voltage.

In particular, if control terminal 37 is connected to a positive potential such as that normally applied to bias terminal 32, the driver circuit will function in the current driving mode described in the aforementioned application of V. R. Saari. It will be recognized that with control terminal 37 and bias terminal 32 commonly connected to a positive bias voltage, the base-emitter junction of transistor 38 is reverse biased by an amount equal to the collector-base voltage of transistor 30. Accordingly, transistor 38 is cut off and has substantially no effect on the operation of the driver circuit.

Thus, when command signal 10 decreases to voltage $V_0$, at time $t_1$, the current flow through transistor 12 decreases, causing a decrease in the voltage drop across resistor 15 and a corresponding increase in current through transistor 13 and resistor 14. This, in turn, decreases the voltage level at circuit node A which decreases the bias current to transistor 27 so that transistor 29 starts to turn off. Simultaneously a current flow through capacitor 21 is effected. The charging of capacitor 21 through diodes 18 and 19 and resistor 22 decreases the potential at the base of transistor 23, which, in turn, causes current flow into the base electrode of transistor 30 and diode-connected transistor 31 through transistor 24. The interconnection of transistor 30 and diode-connected transistor 31 effectively double the collector current of transistor 24, thereby causing the voltage at the emitter of transistor 30 and output terminal 35 to rise toward the bias potential applied to terminal 32. Diodes 18 and 19 and resistors 20 and 22 provide bias means for sustaining the gate or output current at substantially twice the collector current of transistor 24 as long as command signal 10 remains at its negative-most potential.

When it is desired to operate the driver circuit in a mode in which the driven JFET ON state gate-to-source voltage is limited to a predetermined level, control terminal 37 is connected to source electrode 42 of the driven JFET e.g., by switch 39 of the FIGURE. The JFET ON state is again initiated when command signal 10 decreases to voltage $V_0$, at time $t_1$. As in the previously explained mode of operation, transistor 29 is cut off and transistor 30 begins to conduct, causing the potential at terminal 35, which is connected to the gate electrode of driven JFET 40 to rise toward the positive potential applied to bias terminal 32. In this mode of operation, however, the potential at the base electrode of transistor 38 is less than the potential at the emitter electrode of transistor 38 by an amount equal to the sum of the voltage drop across the base-emitter junction of transistor 30 and the voltage drop across the gate-source junction of driven JFET 40. Thus, the base-emitter junction of transistor 38 is forward biased and transistor 38 is in a conductive state. Since the voltage drop across the base-emitter junction of transistor 38 is substantially equal to the voltage drop across the base-emitter junction of transistor 30, the voltage drop across the gate-source junction of driven JFET 40 is necessarily maintained at a level insufficient to cause substantial conduction through the gate-source junction of JFET 40. That is, both the gate and source electrodes of driven JFET 40 are connected to the collector electrode of transistor 24 by single semiconductor junction, namely the respective base-emitter junctions of transistors 30 and 38. Accordingly, the gate-source voltage of driven JFET 40 is maintained substantially equal to zero during the JFET ON state. In practice, it has been found that when the driver circuit is connected to operate the driven JFET in this voltage limited mode, the gate electrode of the driven JFET is maintained within 300 millivolts of the potential at the driven JFET source electrode.

It will be realized by those skilled in the art that, since the present invention employs the same number of capacitors as employed in the Saari driver circuit, an integrated circuit embodiment comprising that integrated circuit embodiment disclosed in the aforementioned Saari application and the present invention as disclosed in the preceding paragraphs is easily realized.

What is claimed is:

1. In a driver circuit, having an input terminal, and an output terminal for connection to the gate electrode of a field effect transistor, and including first and second transistors, the collector-emitter paths of said first and second transistors serially connected between first and second terminals of fixed potential; a first circuit path connected between said input terminal and the base of said first transistor, said first circuit path including first circuit means for momentarily supplying current to said base of said first transistor in response to a transition between a first and second predetermined voltage level applied to said input terminal, and second circuit means responsive to said second predetermined voltage level for maintaining current to said base of said first transistor during that portion of time said input terminal remains at said second predetermined voltage level; a second circuit path connected between said input terminal and the base of said second transistor, said second circuit path including third circuit means for supplying base current to said second transistor in response to a transition in said signal at said input terminal from said second predetermined voltage level to said first predetermined voltage level and fourth circuit means for maintaining current to said base of said second transistor during that portion of time said input terminal remains at said first predetermined voltage level, the improvement comprising:

a third transistor, the emitter electrode of said third transistor connected to the base of said second transistor, the collector electrode of said third transistor connected to said second terminal of fixed potential, the base electrode of said third transistor connectable to a third terminal of fixed potential such that said junction field effect transistor is operated in an ON state with a predetermined gate current, said base electrode of said third transistor alternatively connectable to the source electrode of said junction field effect transistor such that said junction field effect transistor is operated in an ON state with a substantially constant voltage, of a magnitude insufficient to effect substantial gate current, maintained between the gate and source electrodes.

2. In a driver circuit, having an input terminal, and an output terminal for connection to the gate electrode of a field effect transistor, and including first and second transistors, the collector-emitter paths of said first and second transistors serially connected between first and second terminals of fixed potential; a first circuit path connected between said input terminal and the base of said first transistor, said first circuit path including first circuit means for momentarily supplying current to said base of said first transistor in response to a transition between a first and second predetermined voltage level applied to said input terminal, and second circuit means responsive to said second predetermined voltage level for maintaining current to said base of said first transistor during that portion of time said input terminal remains at said second predetermined voltage level, a second circuit path connected between said input terminal and the base of said second transistor, said second circuit path including third circuit means for supplying base current to said second transistor in response to a transition in said signal at said input terminal from said second predetermined voltage level to said first predetermined voltage level and fourth circuit means for maintaining current to said base of said second transistor during that portion of time said input terminal remains at said first predetermined voltage level, the improvement comprising:

a third transistor, the emitter electrode of said third transistor connected to the base of said second transistor, the collector electrode of said third transistor connected to said second terminal of fixed potential, said base electrode of said third transistor adapted for connection to a third terminal of fixed potential so that during the ON state of said field effect transistor the gate current is established at a predetermined level and said base electrode of said third transistor adapted for alternative connection to the source electrode of said junction field effect transistor so that said field effect transistor is operated in an ON state with a substantially constant voltage between the gate and source electrodes of said field effect transistor.

3. In a driver circuit including first and second transistors connected in cascade between first and second terminals of fixed potential, the commonly connected emitter and collector of said first and second transistors connected to said driver circuit output terminal; a first circuit path connected between the base electrode of said first transistor and a circuit node, said first circuit path including a first capacitor for momentarily supplying current to said base of said first transistor in response to a transition between a first and second predetermined voltage level applied to said circuit node, and circuit means responsive to the potential between the electrodes of said first capacitor for maintaining current to said base of said first transistor during that period of time said signal at said circuit node remains at said second prdetermined voltage level; and a second circuit path connected between the base electrode of said second transistor and said circuit node, said second circuit path including a second capacitor for supplying base current to said second transistor in response to a transition in said signal at said circuit node from said second predetermined voltage level to said first predetermined voltage level and means for supplying a predetermined current to said base of said second transistor during that portion of time said circuit node remains at said first predetermined voltage level, the improvement comprising:

a third transistor, the emitter electrode of said third transistor connected to the base of said second transistor, the collector electrode of said third transistor connected to said second terminal of fixed potential, said base electrode of said third transistor connectable to a third terminal of fixed potential whereby the gate current of a junction field effect transistor connected to said driver circuit output terminal is limited to a predetermined level, said base electrode of said third transistor alternately connectable to the source electrode of said junction field effect transistor whereby a substantially constant voltage is maintained between the gate and source electrodes of said field effect transistors during that portion of time said driver circuit maintains said field effect transistor in a conducting state.

4. In a driver circuit for determining the conductive state of a junction field effect transistor including first and second transistors connected in cascade between first and second terminals of fixed potential, the commonly connected emitter and collector of said first and second transistors connected to said driver circuit output terminal; a first circuit path connected between the base electrode of said first transistor and a circuit node, said first circuit path including a first capacitor for momentarily supplying current to said base of said first transistor in response to a transition between a first and second predetermined voltage level applied to said circuit node, and circuit means responsive to the potential between the electrodes of said first capacitor for maintaining current to said base of said first transistor during that interval of time said signal at said circuit node remains at said second predetermined voltage level; and a second circuit path connected between the base electrode of said second transistor and said circuit node, said second circuit path including a second capacitor for supplying base current to said second transistor in response to a transition in said signal at said circuit node from said second predetermined voltage level to said first predetermined voltage level and means for supplying a predetermined current to said base of said second transistor during that interval of time said circuit node remains at said first predetermined voltage level, the improvement comprising:

a third transistor, the emitter electrode of said third transistor connected to the base of said second transistor, the collector electrode of said third transistor connected to said second terminal of fixed potential, said base electrode of said third transistor connected to a control terminal for selectively determining the operational mode of said driver junction field effect transistor during that interval of time said field effect is in a conductive ON state, said operational mode selectively a conductive state with a predetermined gate current, or in the alternative, a conductive state with a substantially constant gate-source voltage.

5. In a circuit for driving a junction field effect transistor switch connected to the output terminal of said circuit, including first and second transistors connected in cascade between first and second terminals of fixed potential, the commonly connected emitter and collector of said first and second transistors connected to said driver circuit output terminal; a first circuit path connected between the base electrode of said first transistor and a circuit node, said first circuit path including a first capacitor for momentarily supplying current to said base of said first transistor in response to a transition between a first and second predetermined voltage level applied to said circuit node, and circuit means responsive to the potential between the electrodes of said first capacitor for maintaining current to said base of said first transistor during that period of time said signal at said circuit node remains at said second predetermined voltage level; and a second circuit path connected between the base electrode of said second transistor and said circuit node, said second circuit path including a second capacitor for supplying base current to said second transistor in response to a transition in said signal at said circuit node from said second predetermined voltage level to said first predetermined voltage level and means for supplying a predetermined current to said base of said second transistor during that portion of time said circuit node remains at said first predetermined voltage level, the improvement comprising:

a third transistor, the emitter electrode of said third transistor connected to the base of said second transistor, the collector electrode of said third transistor connected to said second terminal of fixed potential, said base electrode of said third transistor connected to a control terminal, said third transistor responsive to a positive potential applied to said control terminal for operating said junction field effect transistor with a substantially constant gate current, said third transistor alternatively responsive to the signal at said source electrode for operating said junction field effect transistor with a substantially constant gate-source voltage.

6. In a switching circuit including a first transistor, the collector of said first transistor connected to a first output terminal of said switching circuit, the emitter of said first transistor connected to a first terminal of fixed potential; a first capacitor connected between the base of said first transistor and a circuit node; first bias means responsive to the signal at the input terminal of said switching circuit for supplying bias to said first transistor during a first predetermined portion of said signal at said input terminal; a second transistor, the emitter of said second transistor connected to said switching circuit output terminal and the collector of said second transistor connected to a second terminal of fixed potential; a third transistor, the collector of said third transistor connected to the base of said second transistor and the emitter of said third transistor connected to said second terminal of fixed potential; second bias means responsive to the signal at said input terminal of said switching circuit for supplying bias to said third transistor during a second predetermined portion of said signal at said input terminal; and a second capacitor connected between the base of said third transistor and said circuit node, the improvement comprising:

a fourth transistor, the emitter of said fourth transistor connected to said base of said second transistor, the collector of said fourth transistor connected to said first terminal of fixed potential and the base of said fourth transistor connected to a control terminal of said switching circuit.

7. A switching circuit comprising:

a first transistor, the collector of said first transistor connected to the output terminal of said switching circuit, the emitter of said first transistor connected to a first terminal of fixed potential;

a first capacitor connected between the base of said first transistor and a circuit node;

first bias means connected in parallel with said first capacitor, said first bias means responsive to the signal applied to the input terminal of said switching circuit for supplying bias to said first transistor during a first predetermined portion of said signal applied to said input terminal;

a second transistor, the emitter of said second transistor connected to said switching circuit output terminal and the collector of said second transistor connected to a second terminal of fixed potential;

a third transistor, the collector of said third transistor connected to the base of said second transistor and the emitter of said third transistor connected to said second terminal of fixed potential;

a fourth transistor, the emitter of said fourth transistor connected to the base electrode of said third transistor and the collector of said fourth transistor connected to a third terminal of fixed potential;

a second capacitor connected between the base of said fourth transistor and said circuit node;

second bias means connected between said base of said fourth transistor and said second terminal of fixed potential, said second bias means responsive to the signal applied to the input terminal of said switching circuit for supplying bias to said fourth transistor during a second predetermined portion of said signal applied to said input terminal; and a fifth transistor, the collector of said fifth transistor connected to said first terminal of fixed potential, the emitter of said fifth transistor connected to the base of said first transistor, and the base of said fifth transistor responsive to an applied signal for controlling the operating mode of said switching circuit.

8. The switching circuit of claim 7 wherein the output terminal of said switching circuit is connected to the gate electrode of a junction field effect transistor and said base of said fifth transistor is connected to a source of positive potential thereby establishing said operating mode of said switching circuit so that said field effect transistor is maintained with a substantially constant predetermined gate current in response to a negative potential applied to the input terminal of said switching circuit.

9. The switching circuit of claim 7 wherein the output terminal of said switching circuit is connected to the gate electrode of a junction field effect transistor and said base of said fifth transistor is connected to the source electrode of said field effect transistor, thereby establishing said operating mode of said switching circuit so that said field effect transistor is maintained with a substantially constant gate-source potential in response to a negative potential applied to said switching circuit input terminal.

* * * * *